(12) United States Patent
Kakimoto

(10) Patent No.: US 8,840,808 B2
(45) Date of Patent: Sep. 23, 2014

(54) PROCESS FOR PRODUCING LIQUID COMPOSITION FOR ORGANIC SEMICONDUCTOR ELEMENT

(75) Inventor: Hidenobu Kakimoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 478 days.

(21) Appl. No.: 13/006,065

(22) Filed: Jan. 13, 2011

(65) Prior Publication Data

US 2011/0204345 A1 Aug. 25, 2011

(30) Foreign Application Priority Data

Jan. 15, 2010 (JP) .................................... 2010-7312

(51) Int. Cl.
*H05B 33/14* (2006.01)
*H05B 33/10* (2006.01)
*H01L 51/00* (2006.01)

(52) U.S. Cl.
CPC ............ *H01L 51/0007* (2013.01); *H05B 33/10* (2013.01)
USPC ..................................... 252/301.16; 252/364

(58) Field of Classification Search
USPC .............................. 252/301.16, 364; 428/917
See application file for complete search history.

(56) References Cited

U.S. PATENT DOCUMENTS

| | | | |
|---|---|---|---|
| 7,244,960 B2 * | 7/2007 | Spreitzer et al. | ................ 257/40 |
| 2006/0269657 A1 | 11/2006 | Shimizu et al. | |
| 2008/0008884 A1 | 1/2008 | Ishii et al. | |

FOREIGN PATENT DOCUMENTS

| | | | |
|---|---|---|---|
| JP | 2004-119351 A | | 4/2004 |
| JP | 2006332406 A | | 12/2006 |
| JP | 2007-087786 | * | 4/2007 |
| JP | 2007-87786 | * | 4/2007 |
| JP | 2007265823 A | | 10/2007 |
| JP | 2008016297 A | | 1/2008 |

OTHER PUBLICATIONS

Translation for JP 2007-87786, Apr. 2007.*
Japanese Patent Office, "Notification of Reasons for Rejection," issued in connection with Japanese Patent Application No. 2011-5994, dated May 27, 2014.

* cited by examiner

*Primary Examiner* — Carol M Koslow
(74) *Attorney, Agent, or Firm* — Sughrue Mion, PLLC

(57) ABSTRACT

A problem to be solved of the present invention is to provide a liquid composition for an organic semiconductor device having good coating property, wherein the lifetime of the function of an organic semiconductor device is prolonged when an organic layer is formed from the liquid composition for an organic semiconductor device, and a process for producing the liquid composition. A mean for solving the problem is a process for producing a liquid composition for an organic semiconductor device comprising a step of dissolving an organic compound which is solid at 1 atm and 25° C. in an organic solvent which is liquid at 1 atm and 25° C. and has a halogen compound concentration of not more than 100 ppm by weight.

10 Claims, 1 Drawing Sheet

US 8,840,808 B2

PROCESS FOR PRODUCING LIQUID COMPOSITION FOR ORGANIC SEMICONDUCTOR ELEMENT

CROSS-REFERENCE TO RELATED APPLICATION

This application relates to and claims the benefit of priority from Japanese Patent Application number 2010-7312, filed on Jan. 15, 2010, the entire disclosure of which is incorporated herein by reference.

TECHNICAL FIELD

The present invention relates to a liquid composition to be used for forming an organic semiconductor device, particularly, relates to a liquid composition to be used for forming an organic electroluminescent device.

BACKGROUND ART

In recent years, the technique using an organic semiconductor device has been attracting attention and, particularly, an organic EL display using an organic electroluminescent (hereinafter referred to as "organic EL" in some cases) device which is one embodiment of the organic semiconductor device has been attracting attention. An organic EL device used in the organic EL display is constituted by including an anode, a cathode, and a light emitting layer which is arranged between the anode and the cathode, and holes and electrons which are injected from the anode and the cathode, respectively, are bound in the light emitting layer, thereby, to emit light.

The organic EL device has an advantage that it is simply produced, and can form an organic layer such as a light emitting layer by a method which is easy in scaling the area up. Specifically, a liquid composition in which a material contained in an organic layer is dissolved or dispersed in an organic solvent is applied to a substrate in which an anode has been formed on a surface by an applying method such as a spin coating method or an inkjet method, and an applied film of the liquid composition is dried to form an organic layer such as a hole injecting layer or a light emitting layer. Thereafter, a cathode layer is formed on the organic layer, thereby, the organic EL device is manufactured.

As a liquid composition for an organic semiconductor device, for example, an applying solution containing a light emitting compound constituting a light emitting layer of an organic EL device, and a mixed solvent containing an aromatic compound is described in patent document 1. This applying solution uses both of a low boiling point aromatic compound and a high boiling point aromatic compound as a solvent. Thereby, this applying solution is controlled to have a relatively low viscosity although it has a relatively high boiling point, and the coating property has been improved.

BACKGROUND ART DOCUMENTS

Patent Documents

Patent Document 1: Japanese Patent Laid-Open Publication No. 2004-119351

DISCLOSURE OF THE INVENTION

Problems to be Solved by the Invention

However, even when an organic layer is formed from a liquid composition having the thus improved coating property, the lifetime of the function of an organic semiconductor device is not sufficiently long and, among the organic semiconductor devices, particularly, regarding an organic electroluminescent device, a luminance half life is not sufficiently long.

It is an object of the present invention to provide a liquid composition for an organic semiconductor device having good coating property, wherein the lifetime of the function of an organic semiconductor device is prolonged when an organic layer is formed from the liquid composition for an organic semiconductor device, and a process for producing the liquid composition. It is also an object of the present invention to provide an organic semiconductor device manufactured using the liquid composition for an organic semiconductor device obtained by the process.

Means for Solving the Problems

In view of the aforementioned problems, the present inventors intensively studied and, as a result, have accomplished the present invention by finding out that a halogen compound which is introduced into a liquid composition for an organic semiconductor device via a certain kind of organic solvent (for example, a compound comprising at least one selected from the group consisting of fluorine, chlorine, bromine, iodine and astatine) adversely influences on an organic layer, eventually, the lifetime of the function of an organic semiconductor device.

That is, the present invention provides a process for producing a liquid composition for an organic semiconductor device, the process comprising a step of dissolving an organic compound which is solid at 1 atm and 25° C. in an organic solvent which is liquid at 1 atm and 25° C. and has a halogen compound concentration of not more than 100 ppm by weight.

In one embodiment, the organic solvent is one obtained by a process comprising a step of reducing the amount of a halogen compound in an organic solvent containing the halogen compound to a halogen compound concentration of not more than 100 ppm by weight.

In one embodiment, the halogen compound is a compound containing bromine.

In one embodiment, the step of reducing the amount of the halogen compound in the organic solvent containing the halogen compound is a distillation step.

In one embodiment, the organic compound is an organic compound which emits fluorescence.

In one embodiment, the organic compound is an organic compound which emits phosphorescence.

In one embodiment, the organic compound is a high-molecular compound.

In one embodiment, the organic solvent is a compound composed of two or more elements selected from the group consisting of carbon, hydrogen, oxygen and nitrogen.

In one embodiment, the organic semiconductor device is an organic electroluminescent device.

In one embodiment, the organic compound is dissolved in the organic solvent so that the amount of the organic compound amount may become not less than 0.01% by weight and not more than 5.0% by weight based on the total weight of the resulting liquid composition in the step of dissolving the organic compound in the organic solvent.

In one embodiment, the liquid composition for an organic semiconductor device is a liquid composition used for forming a light emitting layer of an organic electroluminescent device.

In one embodiment, the liquid composition for an organic semiconductor device is a liquid composition used for forming a charge transporting layer of an organic electroluminescent device.

Also, the present invention provides an organic electroluminescent device having a first electrode, a second electrode, and an organic layer provided between the first electrode and second electrode, wherein the organic layer is a layer formed by applying a liquid composition obtained by any one of the aforementioned processes to the first electrode.

Also, the present invention provides a liquid composition for an organic semiconductor device produced by any one of the aforementioned processes.

Effect of the Invention

When the liquid composition for an organic semiconductor device obtained by the process of the present invention is used, an organic semiconductor device having improved quality of an organic layer and prolonged lifetime can be manufactured by a simple manufacturing process. For example, regarding the organic electroluminescent device, its luminance half life is prolonged. Such an organic electroluminescent device is suitably used in a planar or curved light source of illumination, etc.; a display apparatus such as a segment display apparatus and a dot matrix display apparatus; a backlight of a liquid crystal display apparatus, etc.

EMBODIMENT FOR CONDUCTING THE INVENTION

Figure 1:
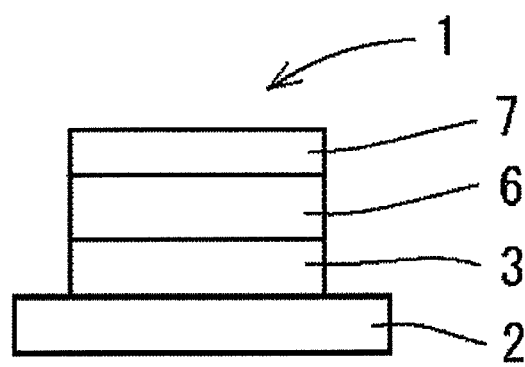
FIG. 1 is a cross-sectional view schematically showing one embodiment of the structure of the organic EL device of the present invention.

Organic solvents generally contain raw material substances or intermediate substances produced in the course of synthesis as impurities. As a result, when an organic solvent is used, for example, in the course of the formation of an organic layer during the formation of an organic semiconductor device, impurities depending on the kind of the organic solvent are introduced into the organic layer of the organic semiconductor device.

An organic solvent to be used in the process of the present invention can dissolve a compound for constituting an organic layer of an organic semiconductor device to provide a liquid composition for an organic semiconductor device and, moreover, it contains a halogen compound. The halogen compound refers to a compound having halogen as a constituent element. The halogen compound is usually contained in the organic solvent as an impurity.

When a liquid composition for an organic semiconductor device, the liquid composition having a high concentration of the halogen compound contained in the organic solvent as an impurity, is used for manufacturing an organic semiconductor device, the lifetime of the function of the organic semiconductor device is shortened. The concentration of the halogen compound which can adversely influence on the lifetime of the function of the organic semiconductor device is, for example, an amount corresponding to about not less than 250 ppm by weight, about not less than 200 ppm by weight or about not less than 150 ppm by weight in the organic solvent, in terms of the amount of bromine atom measured by the method described in EXAMPLES.

In the present specification, the term "ppm" means ppm by weight unless otherwise specified.

Process for Producing Liquid Composition for Organic Semiconductor Device

A process for producing a liquid composition for an organic semiconductor device will be described below, and the details of the liquid composition for an organic semiconductor device, and an organic compound and an organic solvent which are constituent elements of the composition will be described later.

The process for producing a liquid composition for an organic semiconductor device of the present invention comprises a step of dissolving an organic compound which is solid at 1 atm and 25° C. in an organic solvent which is liquid at 1 atm and 25° C. The process of the present invention employs, as the organic solvent, an organic solvent having a halogen compound concentration of not more than 100 ppm by weight.

The organic solvent having a halogen compound concentration of not more than 100 ppm by weight may be a commercially available product or may be an organic solvent obtained by conducting a step of reducing the amount of a halogen compound in an organic solvent containing the halogen compound in a concentration of more than 100 ppm by weight so that the halogen compound concentration may become not more than 100 ppm by weight. The step of reducing the halogen compound amount may be a diluting step or a purifying step. Examples of the purifying step include a distilling step. The diluting step employs as a diluent an organic solvent being lower in halogen compound concentration than the organic solvent to be diluted. The organic solvent which dissolves the organic compound has a halogen compound concentration of preferably not more than 70 ppm by weight, more preferably not more than 50 ppm by weight.

The distillation step may be performed either under normal pressure or under reduced pressure. Examples of the distillation method include a thin film distillation method, a single distillation method, and a precise distillation method. The distillation condition is determined depending on the solvent used, for both under normal pressure and under reduced pressure. In the case of a substance having a high boiling point at normal pressure, and a substance which is easily degraded near a boiling point, the distillation step is usually performed under reduced pressure. By performing the distillation step, the amount of the halogen compound contained in the organic solvent can be reduced.

When the liquid composition for an organic semiconductor device contains two or more kinds of organic solvents, the amount of the halogen compound contained in at least one kind of organic solvent may be reduced, and it is preferable that the amounts of the halogen compounds contained in all organic solvents be reduced. In addition, it is also permissible that two or more kinds of organic solvents are mixed to produce a mixed solvent and, thereafter, the amount of the halogen compound in the mixed solvent is reduced.

In an embodiment, an organic solvent which is employed for the production of the present invention of the liquid composition for an organic semiconductor device is a mixed solvent of a first organic solvent and a second organic solvent. In this instance, the halogen compound concentration or the mixing ratio of each organic solvent is adjusted in consideration of the halogen compound concentration of each organic solvent so that the halogen compound concentration of the mixed solvent may become not more than 100 ppm by weight.

For example, when the first organic solvent has a halogen compound concentration of more than 100 ppm by weight and the second organic solvent has a halogen compound concentration of not more than 100 ppm by weight, it is permissible to perform a step of reducing the amount of the halogen compound contained in the first organic solvent to a halogen compound concentration of not more than 100 ppm by weight and then mix the first organic solvent with the second organic solvent. As a result, in whatever ratio both the solvents are mixed, the halogen compound concentration in the mixed solvent becomes not more than 100 ppm by weight.

In a particularly preferred embodiment, the amount of the halogen compound in the first organic solvent is reduced in the halogen compound amount to a halogen compound concentration of not more than 10 ppm by weight. Also as to the second organic solvent, the amount of the halogen compound is reduced in the halogen compound amount to a halogen compound concentration of not more than 10 ppm by weight. As a result, in whatever ratio both the solvents are mixed, the halogen compound concentration in the mixed solvent becomes not more than 10 ppm by weight.

The process for producing a liquid composition for an organic semiconductor device of the present invention includes a step of dissolving an organic compound which is solid at 1 atm and 25° C. in an organic solvent which is liquid at 1 atm and 25° C.

Examples of the step of dissolving the organic compound in the organic solvent include a method of immersing the organic compound in the organic solvent, and dissolving the organic compound by adding an external factor such as stirring, shaking and ultrasonic wave.

In the step of dissolving the organic compound, the organic compound may be dissolved while heating in a range of from 25° C. to the boiling point of the organic solvent used in order to shorten a necessary time for dissolution. When the boiling point of the organic solvent is not lower than 60° C., it is preferable that the organic compound be dissolved while heating in a range of from 25° C. to 60° C.

When the liquid composition for an organic semiconductor device contains two or more kinds of organic solvents, it is permissible to produce a mixed solvent by mixing two or more kinds of organic solvents and then dissolve the organic compound in the mixed solvent by the aforementioned method, and it is also permissible to dissolve the organic compound in a certain kind of organic solvent and then add other organic solvents.

Examples of the atmosphere under which the organic compound is dissolved in the organic solvent include an air atmosphere, and an atmosphere in which the concentration of an inert gas is not less than the concentration of an inert gas contained in the air atmosphere. The atmosphere in which the concentration of an inert gas is not less than the concentration of an inert gas contained in the air atmosphere may be an atmosphere in which the concentration of an inert gas in the atmosphere is not less than 99% as expressed by a volumetric ratio. Examples of the inert gas include helium gas, argon gas, nitrogen gas, and a mixed gas thereof.

The environment in which the organic compound is dissolved in the organic solvent may be an environment in which light having a wavelength in an ultraviolet light region of not more than 380 nm is shielded. Preferred is an environment in which light having a wavelength of not more than 500 nm is shielded.

The process for producing a liquid composition for an organic semiconductor device of the present invention may include a step other than the step of reducing the amount of the halogen compound contained in the organic solvent and the step of dissolving the organic compound in the organic solvent.

Examples of the other step include the step of filtering the liquid composition for an organic semiconductor device.

Liquid Composition for Organic Semiconductor Device

Then, the liquid composition for an organic semiconductor device used in the present invention will be described.

The liquid composition for an organic semiconductor device in the present invention refers to a liquid composition to be used in manufacturing an organic semiconductor device that exhibits properties as a semiconductor. The organic semiconductor device is constituted with inclusion of an organic layer, and the organic layer is formed from the liquid composition for an organic semiconductor device. Specific examples of the organic semiconductor device include an organic EL device, an organic field effect transistor and an organic solar cell. A preferable organic semiconductor device is an organic EL device.

That is, the liquid composition for an organic semiconductor device is a liquid composition in which a material to be contained in the organic layer of the organic semiconductor device has been dissolved or dispersed in an organic solvent.

First, the organic solvent contained in the liquid composition for an organic semiconductor device to be used in the present invention will be described. The organic solvent is an organic compound which is liquid at 1 atm and 25° C. and contains a halogen compound as an impurity.

Examples of the halogen compounds contained in the organic solvent include a compound containing fluorine atom, a compound containing chlorine atom, a compound containing bromine atom, and a compound containing iodine atom. Compounds having higher effect of prolonging the luminance half life of an organic EL device with their reduction include a compound containing chlorine atom, and a compound containing bromine atom, and compounds having further higher effect include a compound containing bromine atom.

In the present invention, the halogen compound concentration in the organic solvent after the reduction of the amount of the halogen compound contained in the organic solvent is usually less than 100 ppm by weight, preferably less than 70 ppm by weight, more preferably less than 10 ppm by weight, more preferably less than 1 ppm by weight, and it is particularly preferable that the organic solvent contain substantially no halogen compound.

The organic solvent is preferably a compound composed of two or more elements selected from the group consisting of carbon, hydrogen, oxygen, nitrogen and sulfur, more preferably a compound composed of two or more elements selected from the group consisting of carbon, hydrogen, oxygen and nitrogen, more preferably a compound composed of two or more elements selected from the group consisting of carbon, hydrogen and oxygen.

Examples of the organic solvent include hydrocarbon solvents, ether solvents, alcohol solvents, ketone solvents, nitrile solvents, sulfoxide solvents, amide solvents, water and combinations thereof.

Examples of the hydrocarbon solvents include pentane, hexane, cyclohexane, heptane, octane, decahydronaphthalene, petroleum ether, ligroin, benzene, toluene, xylene, ethylbenzene, cumene, pseudocumene, mesitylene, butylbenzene, tetramethylbenzene, tert-butylbenzene, hexylbenzene, heptylbenzene, octylbenzene, nonylbenzene, decathylbenzene, tetralin, cyclohexylbenzene, decalin and methylnaphthalene.

Examples of the ether solvents include diethyl ether, ethyl propyl ether, dipropyl ether, diisopropyl ether, dibutyl ether, methyl-tert-butyl ether, anisole, methylanisole, diphenyl ether, phenoxytoluene, phenoxyxylene, ditolyl ether, tetrahydrofuran, dihydrofuran, dioxane, tetrahydropyran, 4-methyl-1,3-dioxane and 4-phenyl-1,3-dioxane.

Examples of the alcohol solvents include methanol, ethanol, 1-propanol, 2-propanol, 1-butanol, 2-butanol, 2-methyl-1-propanol, 2-methyl-2-propanol, 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol and 4-methylcyclohexanol.

Examples of the ketone solvents include acetone, methyl ethyl ketone, methyl isobutyl ketone, cyclohexanone, isopropyl methyl ketone, 2-pentanone, 3-pentanone, 3-hexanone, diisopropyl ketone, 2-hexanone, cyclopentanone, 4-heptanone, isoamyl methyl ketone, 3-heptanone, 2-heptanone, 4-methoxy-4-methyl-2-pentanone, 5-methyl-3-hexanone, 2-methylcydohexanone, diisobutyl ketone, 5-methyl-2-octanone, 3-methylcydohexanone, 2-cydohexene-1-one, 4-methylcyclohexanone, cycloheptanone, 4-tert-butylcyclohexanone and benzylacetone.

Examples of the nitrile solvents include acetonitrile, acrylonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylenecyanohydrin, succinonitrile, acetonecyanohydrin and 3-n-butoxypropionitrile.

Examples of the sulfoxide solvents include dimethyl sulfoxide, di-n-butyl sulfoxide, tetramethylene sulfoxide and methylphenyl siilkodde.

Examples of the amide solvents include dimethylformamide, dimethylacetamide, acylamide, 2-acetamidoethanol, N,N-dimethyl-m-toluamide, N,N-dimethylacetamide, N,N-diethyldodecaneamide, epsilon-caprolactam, N,N-diethylacetamide, N-tert-butylformamide, formamide, pivalamide, N-butylamide, N,N-dimethylacetoacetamide, N-methylformamide, N,N-diethylformamide, N-formylethylamine, acetamide, N,N-dfisopropylformamide, 1-formylpiperidine and N-methylformanilide.

When the liquid composition for an organic semiconductor device of the present invention contains two kinds of organic solvents, it is preferable, from the viewpoint of film-forming property, that one solvent have a boiling point of not lower than 180° C. and the other solvent have a boiling point of not higher than 180° C., and it is more preferable that one solvent have a boiling point of not lower than 200° C., and the other solvent have a boiling point of not higher than 180° C.

When the liquid composition for an organic semiconductor device of the present invention contains three kinds of organic solvents, it is preferable, from the viewpoint of film-forming property, that at least one solvent among three kinds of solvents is a solvent having a boiling point of not lower than 180° C., and at least one kind of solvent is a solvent having a boiling point of not higher than 180° C., and it is more preferable that at least one solvent among three kinds of solvents is a solvent having a boiling point of from not lower s than 200° C. and not higher than 300° C., and at least one solvent is a solvent having a boiling point of not higher than 180° C.

Among them, preferable organic solvents are mesitylene, cyclohexylbenzene, tetralin, decalin, methylanisole, diphenyl ether, and phenoxytoluene. This is because these solvents have a relatively high boiling point and a low viscosity and enhance the effect of improving the coating property and film-forming property of the liquid composition for an organic semiconductor device.

Then, an organic compound contained in the liquid composition for an organic semiconductor device to be used in the present invention will be described. The organic compound is contained in the liquid composition for an organic semiconductor device, so that it becomes a material which constitutes a layer of an organic semiconductor device. The organic compound is solid at 1 atm and 25° C. It is preferable that the organic compound be a light emitting organic compound which mainly emits fluorescence and/or phosphorescence or a dopant which assists the light emitting function of such a light emitting organic compound. The dopant is added to the light emitting organic compound which emits fluorescence and/or phosphorescence, for example, for improving a light emitting efficiency or changing a light emitting wavelength. The organic compound may be a low-molecular compound or a high-molecular compound which can form a film by applying the liquid composition. From the viewpoint of film-forming property, a high-molecular compound is preferable, and a high-molecular compound having a polystyrene-equivalent number average molecular weight of from $10^3$ to $10^8$ is more preferable.

Examples of the high-molecular compound include polyp araphenylenevinylene derivatives, polythiophene derivatives, polyp araphenylene derivatives, polysilane derivatives, polyacetylene derivatives, polyfluorene derivatives, polyvinylcarbazole derivatives, and pigment-based dopant materials and metal complex-based dopant materials, which have been high-molecularized, as exemplified below.

Examples of the low-molecular compound include distyrylarylene derivatives, oxadiazole derivatives and carbazole derivatives represented by CBP.

Among the light emitting organic compounds, examples of a material which emits blue light include distyrylarylene derivatives, oxadiazole derivatives, and polymers thereof, polyvinylcarbazole derivatives, polyparaphenylene derivatives, and polyfluorene derivatives. Among them, polyvinylcarbazole derivatives, polyparaphenylene derivatives and polyfluorene derivatives, which are high-molecular compounds, are preferable.

In addition, examples of a material which emits green light include quinacridone derivatives, coumarin derivatives, and polymers thereof, polyparaphenylenevinylene derivatives and polyfluorene derivatives. Among them, polyparaphenylenevinylene derivatives and polyfluorene derivatives, which are high-molecular compounds, are preferable.

In addition, examples of a material which emits red light include coumarin derivatives, thiophene ring compounds, and polymers thereof, polyparaphenylenevinylene derivatives, polythiophene derivatives, and polyfluorene derivatives. Among them, polyparaphenylenevinylene derivatives, polythiophene derivatives, and polyfluorene derivatives, which are high-molecular compounds, are preferable.

Examples of the pigment-based dopant materials include cydopendamine derivatives, tetraphenylbutadiene derivative compounds, triphenylamine derivatives, oxadiazole derivatives, pyrazoloquinoline derivatives, clistyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimers, pyrazoline dimers, quinacridone derivatives, coumarin derivatives, rubrene derivatives, squalium derivatives, porphyrin derivatives, tetracene derivatives, pyrazolone derivatives, decacyclene, and phenoxazone.

Examples of the metal complex-based dopant materials include metal complexes having Al, Zn, Be, etc., or rare earth metals such as Tb, Eu and Dy as a central metal, and having an oxadiazole, thiadiazole, phenylpyridine, phenylbenzimidazole or quinoline structure as a ligand. Examples of the metal complexes include metal complexes having luminescence from the triplet excited state such as iridium complexes and platinum complexes, alumiquinolinol complexes, benzoquinolinol beryllium complexes, benzoxazolyl zinc complexes, benzothiazole zinc complexes, azomethyl zinc complexes, porphyrin zinc complexes, and europium complexes.

Regarding the concentration of the organic compound contained in the liquid composition for an organic semiconductor device of the present invention, it is preferable that the organic compound be contained in a proportion of not less than 0.01% by weight and not more than 10.0% by weight, based on the total weight of the liquid composition for an organic semiconductor device. More preferably, the organic compound is contained in a proportion of not less than 0.01% by weight and not more than 5.0% by weight. More preferably, the organic compound is contained in a proportion of not less than 0.1% by weight and not more than 5.0% by weight. Although the viscosity of the liquid composition for an organic semiconductor device varies depending on an applying method to be used for application, it is preferably in a range of from 0.5 to 500 mPa·s at 25° C. and, in the case of an applying method of discharging the liquid composition for an organic semiconductor device from a discharging apparatus, such as an inkjet printing method, the viscosity is preferably in a range of from 0.5 to 20 mPa·s at 25° C., in order to prevent clogging at discharge and flight bend.

The liquid composition for an organic semiconductor device may further contain an additive for adjusting a viscosity and/or surface tension, and an antioxidant.

Examples of the additive for adjusting a viscosity and/or surface tension which may be contained in the liquid composition for an organic semiconductor include high-molecular weight compounds (thickening agents) and poor solvents for increasing a viscosity, low-molecular weight compounds for reducing a viscosity and surfactants for reducing surface tension, and these additives are used in appropriate combination.

The high-molecular weight compounds may be any compounds as far as they do not inhibit light emission nor charge transportation, and they are usually compounds soluble in the organic solvent contained in the liquid composition for an organic semiconductor device. Examples of the high-molecular weight compounds include high-molecular weight polystyrene, and high-molecular weight polymethyl methacrylate. The high-molecular weight compounds have a polystyrene-equivalent weight average molecular weight of preferably not less than 500000, preferably not less than 1000000.

Further, it is also possible to use a poor solvent as a thickening agent. By the addition of a small amount of the poor solvent to the organic compound in the liquid composition for an organic semiconductor device, the viscosity of the liquid composition for an organic semiconductor device can be increased. When the poor solvent is added, the kind and an amount of the added poor solvent may be selected in such a range that a solid matter in the liquid composition for an organic semiconductor device is not precipitated. In view of stability in storage, the amount of the poor solvent is preferably not more than 50% by weight, more preferably not more than 30% by weight based on the total of the liquid composition.

The low-molecular weight compounds may be any compounds as far as they do not inhibit light emission nor charge transportation, and they are usually compounds soluble in the organic solvent contained in the liquid composition for an organic semiconductor device.

The surfactants may be any surfactants as far as they do not inhibit light emission nor charge transportation, and they are usually compounds soluble in the organic solvent contained in the liquid composition for an organic semiconductor device. Examples of the surfactants include surfynol.

The antioxidant which may be contained in the liquid composition for an organic semiconductor device may be any antioxidant which does not inhibit light emission nor charge transportation. By the use of the antioxidant, the storage stability of the liquid composition for an organic semiconductor device of the present invention can be improved.

Organic EL Device

Then, an organic EL device will be described as an example of the organic semiconductor device of the present invention. FIG. 1 is a cross-sectional view schematically showing one embodiment of the structure of the organic EL device of the present invention. This organic EL device 1 has, on a substrate 2, a first electrode 3, a second electrode 7, and an organic layer 6 provided between the first electrode and the second electrode.

By taking the organic EL device 1 shown in FIG. 1 as an example, the step of forming the organic layer 6 will be described below, and the details of other constituent elements of the organic EL device 1 will be described later.

A thin film containing an organic compound in the organic layer 6 is formed by applying a liquid composition for an organic semiconductor device obtained by the process for producing a liquid composition for an organic semiconductor device of the present invention to the first electrode 3.

Examples of an applying method using the liquid composition for an organic semiconductor device include a spin coating method, a casting method, a microgravure coating method, a gravure coating method, a bar coating method, a roll coating method, a wire bar coating method, a dip coating method, a spray coating method, a screen printing method, a flexo printing method, an offset printing method, a gravure printing method and an inkjet printing method.

It is preferable that the organic layer 6 is formed under an atmospheric environment or under an atmosphere in which a concentration of the inert gas in the atmosphere is not less than a concentration of the inert gas contained in the atmospheric environment. Examples of the inert gas include helium gas, argon gas, nitrogen gas, and a mixed gas thereof and, among them, nitrogen gas is preferable from the viewpoint of easiness in device manufacturing.

From the viewpoint of lifetime property of the organic EL device, it is preferable that the organic layer 6 is formed under an atmosphere in which an oxygen concentration is not more than 1000 ppm as expressed by a volumetric ratio and/or a moisture concentration is not more than 1000 ppm as expressed by a volumetric ratio, and it is more preferable that the organic layer 6 is formed under an atmosphere in which an oxygen concentration is not more than 10 ppm as expressed by a volumetric ratio and/or a moisture concentration is not more than 10 ppm as expressed by a volumetric ratio.

It is preferable that, after formation of the organic layer 6, the organic layer 6 is fired in the state where the oxygen concentration and the moisture concentration in the atmosphere are retained at not more than 1000 ppm as expressed by a volumetric ratio, respectively. The baking of the organic layer 6 is usually performed subsequent to the step of forming the organic layer 6. By this baking, the solvent contained in the organic layer is removed.

It is preferable that the baking is performed at a temperature in a range of from 50° C. to 250° C., from the viewpoint of light emitting property and lifetime property of the organic EL device. A baking time is appropriately selected depending on the components of the organic compound contained in the organic layer 6, and is, for example, usually around from 5 minutes to 2 hours.

It is preferable that the baking of the organic layer 6 is performed under an atmosphere containing an inert gas, from the viewpoint of increasing lifetime of the organic EL device. Examples of the inert gas include helium gas, argon gas, nitrogen gas, and a mixed gas thereof and, among them, nitrogen gas is preferable from the viewpoint of easiness in device manufacturing. These inert gases are introduced into an accommodation apparatus for accommodating a device precursor. A concentration of the inert gas in the atmosphere is usually not less than 99%, preferably not less than 99.5% as expressed by a volumetric ratio.

In addition, from the viewpoint of light emitting property and lifetime property of the organic EL device, it is preferable that the baking of the organic layer 6 is performed in the state where the oxygen concentration and the moisture concentration in the atmosphere are retained at not more than 600 ppm as expressed by a volumetric ratio, respectively, it is more preferable that the oxygen concentration and the moisture concentration are not more than 300 ppm as expressed by a volumetric ratio, respectively, it is further preferable that the oxygen concentration and the moisture concentration are not more than 100 ppm as expressed by a volumetric ratio, respectively, and it is particularly preferable that the oxygen concentration and the moisture concentration are not more than 10 ppm as expressed by a volumetric ratio, respectively.

In addition, it is preferable that the baking of the organic layer 6 is performed under an atmosphere at not more than 10 Pa, from the viewpoint of increasing lifetime of the organic EL device. It is preferable that baking of the organic layer 6 is performed in an accommodation apparatus into which an inert gas is introduced and, at the same time, where pressure is reduced. When baking is performed under a pressure-reduced atmosphere, the solvent contained in the organic layer 6 can be removed more as compared with baking under the atmospheric pressure.

By forming the second electrode 7 on the organic layer 6 after formation of an organic film contained in the organic layer 6, the organic EL device 1 is manufactured.

In a preferable embodiment of the present invention, the first electrode 3 is an anode, the second electrode 7 is a cathode, and the organic layer 6 is a light emitting layer in the organic EL device 1.

Figure 2:
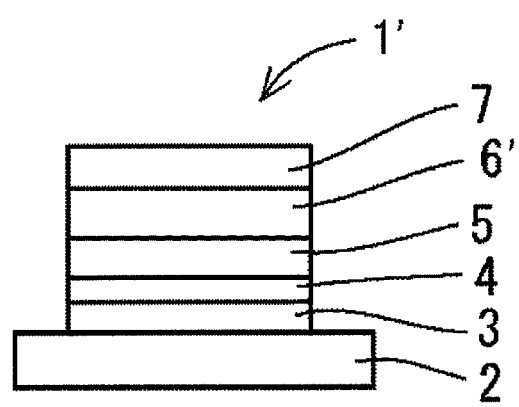
FIG. 2 is a cross-sectional view schematically showing another embodiment of the structure of the organic EL device of the present invention.

FIG. 2 is a cross-sectional view schematically showing another embodiment of the structure of the organic EL device of the present invention. This organic EL device 1' has, on a substrate 2, a first electrode 3, a second electrode 7, a first organic layer 4, a second organic layer 5 and a third organic layer 6' provided between the first electrode 3 and the second electrode 7.

In a preferable embodiment of the present invention, the first electrode 3 is an anode, and the second electrode 7 is a cathode in the organic EL device 1'. In this case, constitution of the organic layer is such that the third organic layer 6' adjacent to the cathode is a light emitting layer. The first organic layer 4 positioned between the third organic layer and the first electrode is a hole injecting layer, and the second organic layer 5 is a hole transporting layer.

By taking the organic EL device shown in FIG. 2 as an example, the step of forming the organic layer will be described below, and the details of other constituent elements of the organic EL device will be described later.

The organic layer is formed by applying a liquid composition for an organic semiconductor device to the first electrode. The formation of the organic layer by applying the liquid composition for an organic semiconductor device to the first electrode includes the case where the organic layer is formed by applying the liquid composition for an organic semiconductor device to a surface of the first electrode, the case where the organic layer is formed by applying the liquid composition for an organic semiconductor device to a surface of the hole injecting layer present above the first electrode, and the case where the organic layer is formed by applying the liquid composition for an organic semiconductor device to a surface of the hole transporting layer present above the first electrode.

The step of forming the third organic layer 6' as a light emitting layer is performed in the same manner as the step of forming the organic layer 6 in the organic EL device 1 described above.

The second organic layer 5 means a layer which is adjacent with the light emitting layer, and has the function of transporting charges (charge transporting layer).

By taking the second organic layer 5 as a hole transporting layer as an example, a method of forming the organic layer will be described below. In this case, the first organic layer 4 is a hole injecting layer.

First, the first electrode 3 and the first organic layer 4 are formed on the substrate 2. Thereafter, the liquid composition for an organic semiconductor device obtained by the process for producing a liquid composition for an organic semiconductor device of the present invention is applied to the first organic layer 4 to form the second organic layer 5.

It is preferable that the hole transporting layer 5 is formed under the atmospheric pressure or under an atmosphere containing an inert gas, in that the organic EL device can be easily manufactured. Examples of the inert gas include helium gas, argon gas, nitrogen gas, and a mixed gas thereof and, among them, nitrogen gas is preferable from the viewpoint of easiness in device manufacturing.

The hole transporting layer 5 may be formed, for example, under an atmospheric environment, or under an atmosphere in which a concentration of the inert gas in the atmosphere is usually not less than 99% as expressed by a volumetric ratio. From the viewpoint of increasing device lifetime, it is preferable that the hole transporting layer is formed under an atmosphere in which a concentration of the inert gas is not less than 99.5%.

From the viewpoint of light emitting property and lifetime property of the organic EL device, it is preferable that the hole transporting layer 5 is formed under an atmosphere in which the oxygen concentration is not more than 1000 ppm as expressed by a volumetric ratio and/or the moisture concentration is not more than 1000 ppm as expressed by a volumetric ratio, and it is further preferable that the hole transporting layer 5 is formed under an atmosphere in which the oxygen concentration is not more than 10 ppm as expressed by a volumetric ratio and/or the moisture concentration is not more than 10 ppm as expressed by a volumetric ratio.

It is preferable that, after formation of the hole transporting layer 5, the hole transporting layer 5 is baked in the state where the oxygen concentration and the moisture concentration in the atmosphere are retained at not more than 1000 ppm as expressed by a volumetric ratio, respectively. By this baking, the solvent contained in the hole transporting layer 5 is removed.

It is preferable that the baking is performed at a temperature in a range of from 50° C. to 250° C., from the viewpoint of light emitting property and lifetime property of the organic EL device. A baking time is appropriately selected depending on the components of the organic compound contained in the hole transporting layer 5, and is usually from around 5 minutes to 2 hours.

It is preferable that the baking of the hole transporting layer 5 is performed under an atmosphere containing an inert gas, from the viewpoint of increasing lifetime of the organic EL device. Examples of the inert gas include helium gas, argon gas, nitrogen gas and a mixed gas thereof and, among them, nitrogen gas is preferable from the viewpoint of easiness in device manufacturing. These inert gases are introduced into an accommodation apparatus for accommodating a device precursor. A concentration of the inert gas in the atmosphere is usually not less than 99%, preferably not less than 99.5% as expressed by a volumetric ratio.

It is preferable that the baking of the hole transporting layer 5 is performed under an atmosphere at not more than 10 Pa, from the viewpoint of increasing lifetime of the organic EL device. It is preferable that the baking of the hole transporting layer 5 is performed in an accommodation apparatus into which the inert gas is introduced and, at the same time, where pressure is reduced.

In addition, from the viewpoint of light emitting property and lifetime property of the organic EL device, it is preferable that formation of the hole transporting layer 5 and baking of the hole transporting layer are performed in the state where the oxygen concentration and the moisture concentration in the atmosphere are retained at not more than 600 ppm as expressed by a volumetric ratio, respectively, it is more preferable that the oxygen concentration and the moisture concentration are not more than 300 ppm as expressed by a volumetric ratio, respectively, it is further preferable that the oxygen concentration and the moisture concentration are not more than 100 ppm as expressed by a volumetric ratio, respectively, and it is particularly preferable that the oxygen concentration and the moisture concentration are not more than 10 ppm as expressed by a volumetric ratio, respectively.

By forming the third organic layer 6' as a light emitting layer on the hole transporting layer 5 by the aforementioned method after formation of the hole transporting layer 5, and further forming the second cathode 7 thereon, the organic EL device 1' is manufactured.

Device constitutions of the organic EL device, and each constituent element will be described in more detail below.

The organic EL device of the present invention has a first electrode, a second electrode, and a light emitting layer arranged between the first electrode and the second electrode, as essential constituent features. In addition, an additional functioning layer in addition to the light emitting layer is provided between the first electrode (e.g. anode) and the second electrode (e.g. cathode), for example, for improving device properties, in some cases.

Examples of the functional layer provided between the cathode and the light emitting layer include an electron injecting layer, an electron transporting layer, and a hole blocking layer. In addition, when both layers of the electron injecting layer and the electron transporting layer are provided between the cathode and the light emitting layer, a layer in contact with the cathode is referred to as an electron injecting layer, and layers except for this electron injecting layer are referred to as electron transporting layers, in some cases.

The electron injecting layer is a layer having the function of improving an efficiency of electron injection from the cathode. The electron transporting layer is a layer having the function of improving electron injection from the cathode, the electron injecting layer or the electron transporting layer closer to the cathode. The hole blocking layer is a layer having the function of blocking transportation of holes. In addition, when the electron injecting layer, and/or the electron transporting layer have the function of blocking transportation of holes, these layers also serve as the hole blocking layer, in some cases.

It can be confirmed, for example, by manufacturing a device which flows only a hole current that the hole blocking layer has the function of blocking transportation of holes. For example, a device which is not provided with the hole blocking layer, and flows only a hole current, and a device having a constitution that the hole blocking layer is inserted into the above device are manufactured, and it can be confirmed by decrease in a current value of the device provided with the hole blocking layer that the hole blocking layer exhibits the function of blocking transportation of holes.

Examples of a layer provided between the anode and the light emitting layer include a hole injecting layer, a hole transporting layer and an electron blocking layer. When both layers of the hole injecting layer and the hole transporting layer are provided between the anode and the light emitting layer, a layer in contact with the anode is referred to as a hole injecting layer, and layers except for this hole injecting layer are referred to as hole transporting layers, in some cases.

The hole injecting layer is a layer having the function of improving an efficiency of hole injection from the anode. The hole transporting layer is a layer having the function of improving hole injection from the anode, the hole injecting layer, or the hole transporting layer closer to the anode. The electron blocking layer is a layer having the function of blocking transportation of electrons. In addition, when the hole injecting layer, and/or the hole transporting layer have the function of blocking transportation of electrons, these layers also serve as the electron blocking layer, in some cases.

It can be confirmed, for example, by manufacturing a device which flows only an electron current that the electron blocking layer has the function of blocking transportation of electrons. For example, a device which is not provided with the electron blocking layer, and flows only an electron current, and a device having a constitution that the electron blocking layer is inserted into the above device are manufactured, and it can be confirmed by decease in a current value of the device provided with the electron blocking layer that the electron blocking layer exhibits the function of blocking transportation of electrons.

One example of device constitutions which can be taken by the organic EL device of the present embodiment will be shown below.

a) Anode/hole injecting layer/light emitting layer/cathode
b) Anode/hole injecting layer/light emitting layer/electron injecting layer/cathode
c) Anode/hole injecting layer/light emitting layer/electron transporting layer/cathode
e) Anode/hole injecting layer/light emitting layer/electron transporting layer/electron injecting layer/cathode
f) Anode/hole transporting layer/light emitting layer/cathode
d) Anode/hole transporting layer/light emitting layer/electron injecting layer/cathode
e) Anode/hole transporting layer/light emitting layer/electron transporting layer/cathode
f) Anode/hole transporting layer/light emitting layer/electron transporting layer/electron injecting layer/cathode g) Anode/hole injecting layer/hole transporting layer/light emitting layer/cathode
h) Anode/hole injecting layer/hole transporting layer/light emitting layer/electron injecting layer/cathode
i) Anode/hole injecting layer/hole transporting layer/light emitting layer/electron transporting layer/cathode
j) Anode/hole injecting layer/hole transporting layer/light emitting layer/electron transporting layer/electron injecting layer/cathode
k) Anode/light emitting layer/electron injecting layer/anode
l) Anode/light emitting layer/electron transporting layer/cathode
m) Anode/light emitting layer/electron transporting layer/electron injecting layer/cathode
(wherein, a symbol "/" indicates that respective layers holding the symbol "/" is laminated as being adjacent with each other. The same shall apply hereinafter.)

The organic EL device may have two or more layers of light emitting layers. When layers provided between the anode and the cathode are defined as "repeating unit A", respectively, in each constitution shown in a) to m), an example of an organic EL device having two layers of light emitting layers includes a device constitution shown in the following n).
n) Anode/(repeating unit A)/charge generating layer/(repeating unit A)/cathode In addition, when "(repeating unit A)/charge generating layer" is defined as "repeating unit B", a specific example of an organic EL device having three or more layers of light emitting layers includes a device constitution shown in the following o).
o) Anode/(repeating unit B)x/(repeating unit/cathode Wherein, a symbol "x" represents an integer of not less than 2, and "(repeating unit B)x" represents a constitution in which (repeating unit B)s are laminated to the number of "x". The charge generating layer is a layer in which holes and electrons are generated by applying the electric filed. Examples of the charge generating layer include thin films composed of vanadium oxide, indium tin oxide (abbreviation ITO), molybdenum oxide etc.

The organic EL device may be further covered with a sealing member such as a sealing film or a sealing plate for sealing. When the organic EL device is provided on a substrate, an anode is usually arranged on a substrate side, but a cathode may be arranged on a substrate side.

In the organic EL device of the present embodiment, in order to take out light generated in the interior, usually, all layers arranged on a side of taking out light based on the light emitting layer are made to be transparent. It is preferable that an extent of transparency is such that a visible light transmittance between the most outer surface of the organic EL device on a side of taking out light, and the light emitting layer is not less than 40%. In the case of the organic EL device which is required to emit light in an ultraviolet region or an infrared region, it is preferable that a light transmittance of not less than 40% in the region is exhibited.

In the organic EL device of the present embodiment, an insulating layer having a film thickness of not more than 2 nm may be further provided adjacent with the electrode, in order to improve adherability with the electrode and to improve property of charge injection from the electrode. In addition, in order to improve adherability at an interface and prevent mixing, a thin buffer layer may be inserted between the aforementioned respective layers.

An order and the layer number of layers to be laminated, and a thickness of each layer can be appropriately set in view of a light emitting efficiency and a device lifetime.

Then, a material of, and a method of forming each layer constituting the organic EL device will be more specifically described.

<Substrate>

As a the substrate, a material which does not chemically change in the step of manufacturing the organic EL device is preferably used and, for example, a glass, a plastic, a polymer film, and a silicon substrate as well as a laminate thereof are used.

<Anode>

As the anode, in the case of an organic EL device having a constitution that light from the light emitting layer is taken out through the anode, a transparent or translucent electrode is used. As the transparent electrode or the translucent electrode, a thin film of metal oxide, metal sulfide and a metal having high electric conductivity can be used, and a thin film having high light transmittance is preferably used. Specifically, thin films composed of indium oxide, zinc oxide, tin oxide, ITO, indium zinc oxide (abbreviation IZO), gold, platinum, silver, and copper are used and, among them, thin films composed of ITO, IZO, or tin oxide are preferably used. Examples of a method of manufacturing the anode include a vacuum deposition method, a sputtering method, an ion plating method, and a plating method. Further, as the anode, an organic transparent electrically conductive film of polyaniline or a derivative thereof, or polythiophene or a derivative thereof may be used.

In the anode, a material which reflects light may be used and, as the material, a metal, metal oxide and metal sulfide having a work function of not less than 3.0 eV are preferable.

A film thickness of the anode can be appropriately selected in view of permeability of light and electric conductivity, and is, for example, from 10 nm to 10 μm, preferably from 20 nm to 1 μm, more preferably from 50 nm to 500 nm.

<Hole Injecting Layer>

Examples of a hole injecting material constituting the hole injecting layer include oxides such as vanadium oxide, molybdenum oxide, ruthenium oxide and aluminum oxide, as well as phenylamine-based compounds, star burst-type amine-based compounds, phthalocyanine-based compounds, amorphous carbon, polyaniline, and polythiophene derivatives.

Examples of a method of forming a film of the hole injecting layer include film formation from a solution containing the hole injecting material. A solvent used in film formation from a solution is not particularly limited as far as it dissolves the hole injecting material, and the aforementioned organic solvents etc. may be used.

Examples of a method of forming a film from a solution include applying methods such as a spin coating method, a casting method, a nozzle coating method, a microgravure coating method, a gravure coating method, a bar coating method, a roll coating method, a wire bar coating method, a dip coating method, a spray coating method, a screen printing method, a flexo printing method, an offset printing method, and an inkjet printing method.

A film thickness of the hole injecting layer varies in an optimal value depending on a material used, is appropriately set so that a driving voltage and a light emitting efficiency become an adequate value, and is necessary a thickness such that at least a pinhole is not generated and, when the film thickness is too large, since the driving voltage of a device becomes higher, and thus this is not preferable. Therefore, the film thickness of the hole injecting layer is, for example, from 1 nm to 1 μm, preferably 2 nm to 500 nm, more preferably from 5 nm to 200 nm.

Hole Transporting Layer

Examples of a hole transporting material constituting the hole transporting layer include polyvinyl carbazole or a derivative thereof, polysilane or a derivative thereof, a polysiloxane derivative having aromatic amine on a side chain or the main chain, a pyrazoline derivative, an arylamine derivative, a stilbene derivative, a triphenyldiamine derivative, polyaniline or a derivative thereof, polythiophene or a derivative thereof, polyarylamine or a derivative thereof, polypyrrole or a derivative thereof, poly(p-phenylenevinylene) or a derivative there of, or poly(2,5-thienylenevinylene) or a derivative thereof, a polyfluorene derivative and a high-molecular compound having an aromatic amine residue.

Among them, as the hole transporting material, polyvinyl carbazole or a derivative thereof, polysilane or a derivative thereof, a polysiloxane derivative having an aromatic amine residue on a side chain or the main chain, polyaniline or a derivative thereof, polythiophene or a derivative thereof, polyarylamine or a derivative thereof, poly(p-phenylenevinylene) or a derivative thereof, or poly(2,5-thienylenevinylene) or a derivative thereof, a polyfluorene derivative and a high-molecular compound having an aromatic amine residue are preferable, and further preferred are polyvinyl carbazole or a derivative thereof, a polyfluorene derivative and a high-molecular compound having an aromatic amine residue. In the case of a low-molecular hole transporting material, it is preferable to use the material by dispersing it in a polymer binder.

Examples of a method of forming a film of the hole transporting layer are not particularly limited, and in the case of the low-molecular hole transporting material, include film formation from a mixed solution containing the polymer binder and the hole transporting material and, in the case of the high-molecular hole transporting material, include film formation from a solution containing the hole transporting material.

A solvent used in forming a film from a solution is not particularly limited as far as it dissolves the hole transporting material, and the aforementioned organic solvents etc. may be used.

Examples of a method of forming a film from a solution include the same applying method as the aforementioned method of forming a film of the hole injecting layer and, from the viewpoint of increasing lifetime, it is preferable that a film is formed under the same atmosphere as that of the step of forming an organic layer.

As the polymer binder to be mixed, a polymer binder which does not extremely inhibit charge transportation is preferable, and a polymer binder which is weak in absorption of visible light is preferably used, and examples thereof include polycarbonate, polylacrylate, polymethyl acrylate, polymethyl methacrylate, polystyrene, polyvinyl chloride, and polysiloxane.

A film thickness of the hole transporting layer varies in an optimal value depending on a material used, is appropriately set so that a driving voltage and a light emitting efficiency become an adequate value, and is necessary a thickness such that at least a pinhole is not generated and, when the film thickness is too large, since the driving voltage of a device becomes higher, and thus this is not preferable. Therefore, the film thickness of the hole transporting layer is, for example, from 1 nm to 1 µm, preferably from 2 nm to 500 nm, more preferably from 5 nm to 200 nm.

Light Emitting Layer

Examples of a material contained in the light emitting layer include the aforementioned light emitting organic compounds. The emitting layer may contain a composition of the light emitting organic compound and the dopant.

In addition, a thickness of the light emitting layer is usually from about 2 nm to 200 nm.

As a method of forming a film of the light emitting layer, a film of the light emitting layer is formed by film formation from a solution containing a light emitting material, as described above. As a solvent used in film formation from a solution, the aforementioned organic solvents etc. may be used.

Examples of a method of applying the solution containing the light emitting material include applying methods such as a spin coating method, a casting method, a microgravure coating method, a gravure coating method, a bar coating method, a roll coating method, a wire bar coating method, a dip coating method, a slit coating method, a capillary coating method, a spray coating method and a nozzle coating method, as well as printing methods such as a gravure printing method, a screen printing method, a flexo printing method, an offset printing method, a reverse printing method and an inkjet printing method. Printing methods such as a gravure printing method, a screen printing method, a flexo printing method, an offset printing method, a reverse printing method, and an inkjet printing method are preferable in that pattern formation and color-coding of multiple colors are easily performed.

Electron Transporting Layer

As an electron transporting material constituting the electron transporting layer, known electron transporting materials can be used, and examples thereof include an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, or a metal complex of 8-hydroxyquinoline or a derivative thereof, polyquinoline or a derivative thereof, polyquinoxaline or a derivative thereof, and polyfluorene or a derivative thereof.

Among them, as the electron transporting material, an oxadiazole derivative, benzoquinone or a derivative thereof, anthraquinone or a derivative thereof, or a metal complex of 8-hydroxyquinoline or a derivative thereof, polyquinoline or a derivative thereof, polyquinoxaline or a derivative thereof, and polyfluorene or a derivative thereof are preferable, and 2-(4-biphenylyl)-5-(4-tert-butylphenyl)-1,3,4-oxadiazole, benzoquinone, anthraquinone, tris(8-quinolinol)aluminum, and polyquinoline are further preferable.

A method of forming a film of the electron transporting layer is not particularly limited, but in the case of a low-molecular electron transporting material, examples thereof include a method of vacuum deposition from a powder, or film formation from a solution or molten state and, in the case of a high-molecular electron transporting material, examples thereof include film formation from a solution or molten state. In addition, in the case of film formation from a solution or the molten state, a polymer binder may be used in combination. Examples of a method of forming a film of the electron transporting layer from a solution include the same method of forming a film as the method of forming a film of the hole transporting layer from a solution, and it is preferable that the film is formed under the same atmosphere as that of the step of forming an adjacent layer.

A film thickness of the electron transporting layer varies in an optimal value depending on a material used, is appropriately set so that a driving voltage and a light emitting efficiency become an adequate value, and is necessary a thickness such that at least a pinhole is not generated and, when the film thickness is too large, since the driving voltage of a device becomes higher, and thus this is not preferable. Therefore, the film thickness of the electron transporting layer is, for example, from 1 nm to 1 µm, preferably from 2 nm to 500 nm, more preferably from 5 nm to 200 nm.

<Electron Injecting Layer>

As a material constituting the electron injecting layer, an optimal material is appropriately selected depending on a kind of the light emitting layer, and examples thereof include an alkali metal, an alkaline earth metal, an alloy containing one or more kinds of alkali metal and alkaline earth metal, an oxide, halide, and carbonate of an alkali metal or an alkaline earth metal, or a mixture of these metals. Examples of the alkali metal, and the oxide, halide and carbonate of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. In addition, examples of the alkaline earth metal, and the oxide, halide and carbonate of the alkaline earth metal include magnesium, calcium, barium, strontium, magnesium oxide, magnesium fluoride, calcium oxide, calcium fluoride, barium oxide, barium fluoride, strontium oxide, strontium fluoride and magnesium carbonate. The electron injecting layer may be constituted with a laminate in which two or more layers are laminated, and examples thereof include LiF/Ca. The electron injecting layer is formed by a deposition method, a sputtering method, and a printing method. As a film thickness of the electron injecting layer, it is preferable from around 1 nm to 1 µm.

<Cathode>

As a material of the cathode, materials which have a small work function, easily inject electrons into the light emitting layer, and have high electrical conductivity are preferable. In addition, in an organic EL device in which light is taken out from an anode side, since light from the light emitting layer is reflected with the cathode to an anode side, as a material of the cathode, materials having high visible light reflectivity are preferable. In the cathode, for example, an alkali metal, an alkaline earth metal, a transition metal and a Group III-B metal can be used. As the material of the cathode, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, alloys of two or more kinds of the metals, alloys of one or more kinds of the metals and one or more kinds of gold, silver, platinum, copper, manganese, titanium, cobalt, nickel, tungsten, and tin, or graphite or a graphite intercalation compound are used. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. In addition, as the cathode, a transparent electrically conductive electrode composed of an electrically conductive metal oxide and an electrically conductive organic substance can be used. Specifically, examples of the electrically conductive metal oxide include indium oxide, zinc oxide, tin oxide, ITO, and IZO, and examples of the electrically conductive organic substance include polyaniline or a derivative thereof, polythiophene or a derivative thereof. In addition, the cathode may be constituted with a laminate in which two or more layers are laminated. In addition, the electron injecting layer is used as the cathode, in some cases.

A film thickness of the cathode is appropriately set in view of electric conductivity and durability, and is, for example, from 10 nm to 10 µm, preferably from 20 nm to 1 µm, more preferably from 50 nm 500 nm.

Examples of a method of manufacturing the cathode include a vacuum deposition method, a sputtering method, and a lamination method of thermally pressing a metal thin film.

<Insulating Layer>

Examples of a material of the insulating layer include metal fluoride, metal oxide, and an organic insulating material. Examples of an organic EL device in which an insulating layer having a film thickness of not more than 2 nm is provided include one in which an insulating layer having a film thickness of not more than 2 nm is provided adjacent with the cathode, and one in which an insulating layer having a film thickness of not more than 2 nm is provided adjacent with the anode.

The above-described organic EL device can be preferably used in curved or planar illumination apparatuses, for example, a planar light source used as a light source of a scanner, and a display apparatus Examples of the display apparatus provided with the organic EL device include an active matrix display apparatus, a passive matrix display apparatus, a segment display apparatus, a dot matrix display apparatus and a liquid crystal display apparatus. In addition, the organic EL device is used as a light emitting device constituting each pixel in the active matrix display apparatus and the passive matrix display apparatus, is used as a light emitting device constituting each segment in the segment display apparatus, and is used as a backlight in the dot matrix display apparatus and the liquid crystal display apparatus.

EXAMPLES

The present invention will be described in more detail below by way of examples, but is not limited to the following examples.

Method of Quantitatively Analyzing Bromine Atom in Organic Solvent

Bromine atom contained in an organic solvent was quantitated by the following method.

An organic solvent (20 mg) was weighted on a board, the board was introduced into an automatic sample burning apparatus ("AQF-100" manufactured by Mitsubishi Chemical Analytech Co., Ltd.), the solvent was burned under an oxygen atmosphere, the product was recovered by dissolving the product in an absorption solution included in the automatic sample burning apparatus and, thereafter, the absorption solution was measured by ion chromatography ("DX-500" manufactured by Dionex) to measure an amount of the bromine atom contained in the organic solvent.

As a measuring condition of ion chromatography, "IonPac AS-17" manufactured by Dionex was used as a column, a 10 mM aqueous potassium hydroxide (KOH) solution was used as an eluent, and a flow rate of the eluent was 1.0 ml/min.

Example 1

Production of Liquid Composition for Organic Semiconductor Device 1

As organic solvents, cyclohexylbenzene (manufacture by Acros, 98% grade) and 4-methylanisole (manufactured by AlfaAeser, 99% grade) were used. When an amount of bromine atom contained in cyclohexylbenzene was measured, 260 ppm by weight of the bromine atom was detected. On the other hand, when an amount of bromine atom contained in 4-methylanisole was measured, the amount was less than 10 ppm by weight which is a detection limit. As the step of reducing an amount of a halogen compound in cyclohexylbenzene, the following distillation under reduced pressure was performed.

A 1 L round flask equipped with a magnetic stirrer, a distilling head, a Liebig condenser, a branched adaptor, receivers (200 mL, and 500 mL), a thermometer (for measuring a tower top temperature), a constant pressure-reduced apparatus provided with a manometer, and a pressure-reduced distillation apparatus provided with a vacuum pump were arranged in an oil bath equipped with a temperature regulator. Cyclohexylbenzene (397 g) was charged thereinto, and pressure was reduced to 0.75 kPa at room temperature. The oil bath was heated to 120° C. while the pressure was retained at from 0.7 to 0.8 kPa, and 105 g was obtained as a first fraction, and 191 g was obtained as a regular fraction. The pressure at distillation of the regular fraction was from 0.71 to 0.73 kPa, and a tower top temperature was from 87.0 to 89.0° C. After distillation of the regular fraction, the bath was cooled to room temperature, and the pressure was returned to the atmospheric pressure. An amount of the tank bottom was 88 g.

An amount of bromine atom in cyclohexylbenzene after the distillation step was 67 ppm by weight.

Cyclohexylbenzene (4 mL) and 4-methylanisole (1 mL) obtained via the step of reducing an amount of a halogen compound were mixed in advance to obtain a mixed solvent. A blue light emitting high-molecular material 1 was added to this mixed solvent so that a concentration of the blue light emitting high-molecular 1 became 1.9% by weight, and the material was dissolved at room temperature under the air atmosphere to obtain a liquid composition for an organic semiconductor device 1.

Example 2

Production of Liquid Composition for Organic Semiconductor Device 2

Cyclohexylbenzene (4 mL) obtained via the step of reducing an amount of a halogen compound, which is the same step as in Example 1, and 4-methylanisole (1 mL) were mixed in advance to obtain the obtained mixed solvent. A green light emitting high-molecular material 1 was added to this mixed solvent so that a concentration of the green light emitting high-molecular 1 became 2.0% by weight, and the material was dissolved at room temperature under the air atmosphere to obtain a liquid composition for an organic semiconductor device 2.

Example 3

Production of Liquid Composition for Organic Semiconductor Device 3

Cyclohexylbenzene (4 mL) obtained via the step of reducing an amount of a halogen compound, which is the same step as in Example 1, and 4-methylanisole (1 mL) were mixed in advance to obtain the obtained mixed solvent. A red light emitting high-molecular material 1 was added to this mixed solvent so that a concentration of the red light emitting high-molecular 1 became 1.9% by weight, and the material was dissolved at room temperature under the air atmosphere to obtain a liquid composition for an organic semiconductor device 3.

Example 4

Manufacture of Organic EL Device Using Liquid Composition for Organic Semiconductor Device 1

An organic EL device having the following constitution was manufactured.

"Glass substrate/ITO (150 nm)/Baytron P (65 nm)/high-molecular compound 1 (20 nm)/blue light emitting high-molecular material 1 (60 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 1 produced in Example 1 was applied to the hole transporting layer by a spin coating method under an air atmosphere, to form a thin film for a light emitting layer having a film thickness of 60 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 4.9 cd/A. In addition, when the device was driven at a constant current at an initial luminance of 5,000 cd/m$^2$, a time during which the luminance became 50% of the initial luminance (luminance half life) was 60 hours.

Example 5

Manufacture of Organic EL Device Using Liquid Composition for Organic Semiconductor Device 2

An organic EL device having the following constitution was manufactured.

"Glass substrate/ITO (150 nm)/Baytron P (65 nm)/high-molecular compound 1 (20 nm)/green light emitting high-molecular material 1 (80 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 2 produced in Example 2 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0\times10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.3 cd/A. In addition, when the device was driven at a constant current at an initial luminance of 8,000 cd/m$^2$, a time during which the luminance became 50% of the initial luminance (luminance half life) was 367 hours.

Example 6

Manufacture of Organic EL Device Using Liquid Composition for Organic Semiconductor Device 3

An organic EL device having the following constitution was manufactured.

"Glass substrate/ITO (150 nm)/Baytron P (65 nm)/high-molecular compound 1 (20 nm)/red light emitting high-molecular material 1 (80 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 3 produced in Example 3 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0\times10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 21.0 cd/A. In addition, when the device was driven at a constant current at an initial luminance of 8,000 cd/m$^2$, a time during which the luminance became 50% of the initial luminance (luminance half life) was 354 hours.

Comparative Example 1

Production of Liquid Composition for Organic Semiconductor Device 4

The same operation as that of Example 1 was performed, except that a halogen compound in cyclohexylbenzene was not reduced, a liquid composition for an organic semiconductor device 4 was obtained.

Comparative Example 2

Production of Liquid Composition for Organic Semiconductor Device 5

The same operation as that of Example 2 was performed, except that a halogen compound in cyclohexylbenzene was not reduced, a liquid composition for an organic semiconductor device 5 was obtained.

Comparative Example 3

Production of Liquid Composition for Organic Semiconductor Device 6

The same operation as that of Example 3 was performed, except that a halogen compound in cyclohexylbenzene was not reduced, a liquid composition for an organic semiconductor device 6 was obtained.

Comparative Example 4

Manufacture of Organic EL Device Using Liquid Composition for Organic Semiconductor Device 4

An organic EL device having the following constitution was manufactured.
"Glass substrate/ITO (150 nm)/Baytron P (65 nm)/high-molecular compound 1 (20 nm)/blue light emitting high-molecular material 1 (60 nm)/Ba (5 nm)/Al (80 nm)"
A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.
Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.
Then, the liquid composition for an organic semiconductor device 4 produced in Comparative Example 1 was applied to the hole transporting layer by a spin coating method under an air atmosphere, to form a thin film for a light emitting layer having a film thickness of 60 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.
Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.
The manufactured organic EL device emitted blue light, and had a maximum current efficiency of 4.7 cd/A. In addition, when the device was driven at a constant current at an initial luminance of 5,000 cd/m$^2$, a time during which the luminance became 50% of the initial luminance (luminance half life) was 48 hours.

Comparative Example 5

Manufacture of Organic EL Device Using Liquid Composition for Organic Semiconductor Device 5

An organic EL device having the following constitution was manufactured.
"Glass substrate/ITO (150 nm)/Baytron P (65 nm)/high-molecular compound 1 (20 nm)/green light emitting high-molecular material 1 (80 nm)/Ba (5 nm)/Al (80 nm)"
A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.
Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.
Then, the liquid composition for an organic semiconductor device 5 produced in Comparative Example 2 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.6 cd/A. In addition, when the device was driven at a constant current at an initial luminance of 8,000 cd/m$^2$, a time during which the luminance became 50% of the initial luminance (luminance half life) was 289 hours.

Comparative Example 6

Manufacture of Organic EL Device Using Liquid Composition for Organic Semiconductor Device 6

An organic EL device having the following constitution was manufactured.
"Glass substrate/ITO (150 nm)/Baytron P (65 nm)/high-molecular compound 1 (20 nm)/red light emitting high-molecular material 1 (80 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 6 produced in Comparative Example 3 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 20.2 cd/A. In addition, when the device was driven at a constant current at an initial luminance of 8,000 cd/m$^2$, a time during which the luminance became 50% of the initial luminance (luminance half life) was 197 hours.

Example 7

Production of Liquid Composition for Organic Semiconductor Device 7

As organic solvents, cyclohexylbenzene (manufacture by Acros, 98% grade) and 4-methylanisole (manufactured by AlfaAeser, 99% grade) were used. An amount of a halogen compound in cyclohexylbenzene was reduced in the same manner as in Example 1. As the step of reducing an amount of a halogen compound in 4-methylanisole, the following distillation under reduced pressure was performed.

A 1 L round flask equipped with a magnetic stirrer, a distilling head, a Liebig condenser, a branched adaptor, receivers (200 mL, and 500 mL), a thermometer (for measuring a tower top temperature), a constant pressure-reduced apparatus provided with a manometer, and a pressure-reduced distillation apparatus provided with a vacuum pump were arranged in an oil bath equipped with a temperature regulator. Then, 4-methylanisole (401 g) (manufactured by AlfaAeser, 99% grade) was charged thereinto, and pressure was reduced to 2.5 kPa at room temperature. The oil bath was heated to 94° C. while the pressure was retained at from 2.0 to 2.5 kPa, and 96 g was obtained as a first fraction, and 195 g was obtained as a regular fraction. The pressure at distillation of the regular fraction was 2.0 kPa, and a tower top temperature was from 65.0 to 65.5° C. After distillation of the regular fraction, the bath was cooled to room temperature, and the pressure was returned to the atmospheric pressure. An amount of the tank bottom was 105 g.

An amount of bromine atom in 4-methylanisole after the distillation step was less than 10 ppm by weight which is a detection limit.

Cyclohexylbenzene (4 mL) in which an amount of a halogen compound was reduced by the same manner as in Example 1, and 4-methylanisole (1 mL) obtained via the step of reducing an amount of a halogen compound were mixed in advance to obtain a mixed solvent. A green light emitting high-molecular material 1 was added to this mixed solvent so that a concentration of the green light emitting high-molecular 1 became 2.0% by weight, and the material was dissolved at room temperature under the air atmosphere to obtain a liquid composition for an organic semiconductor device 7.

Example 8

Production of Liquid Composition for Organic Semiconductor Device 8

Cyclohexylbenzene (4 mL) obtained in the same manner as in Example 1 and 4-methylanisole (1 mL) obtained in the same manner as in Example 7 were mixed in advance to obtain the obtained mixed solvent. A red light emitting high-molecular material 1 was added to this mixed solvent so that a concentration of the red light emitting high-molecular 1 became 1.9% by weight, and the material was dissolved at room temperature under the air atmosphere to obtain a liquid composition for an organic semiconductor device 8.

Example 9

Manufacture of Organic EL Device Using Liquid Composition for Organic Semiconductor Device 7

An organic EL device having the following constitution was manufactured.

"Glass substrate/ITO (150 nm)/Baytron P (65 nm)/high-molecular compound 1 (20 nm)/green light emitting high-molecular material 1 (80 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 7 produced in Example 7 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.7 cd/A. In addition, when the device was driven at a constant current at an initial luminance of 8,000 cd/m², a time during which the luminance became 50% of the initial luminance (luminance half life) was 395 hours.

Example 10

Manufacture of Organic EL Device Using Liquid Composition for Organic Semiconductor Device 8

An organic EL device having the following constitution was manufactured.

"Glass substrate/ITO (150 nm)/Baytron P (65 nm)/high-molecular compound 1 (20 nm)/red light emitting high-molecular material 1 (80 nm)/Ba (5 nm)/Al (80 nm)"

A suspension of poly(3,4)ethylenedioxythiophene/polystyrene sulfonic acid (manufactured by Starck; Baytorn P) was applied to a glass substrate on which an ITO film (anode) having a thickness of 150 nm had been formed by a sputtering method, by a spin coating method to form a thin film having a thickness of 65 nm and, further, the thin film was baked by heating on a hot plate at 200° C. for 10 minutes to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to produce a xylene solution 1. A concentration of the high-molecular compound 1 in this xylene solution 1 was made to be 0.8% by weight Then, under an atmospheric environment, the xylene solution 1 was applied to the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, to obtain a hole transporting layer.

Then, the liquid composition for an organic semiconductor device 8 produced in Example 8 was applied to the hole transporting layer by a spin coating method under an air atmosphere, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 21.4 cd/A. In addition, when the device was driven at a constant current at an initial luminance of 8,000 cd/m², a time during which the luminance became 50% of the initial luminance (luminance half life) was 373 hours.

Synthesis Example

Synthesis of High-Molecular Compound 2 Which is Hole Transporting Material

Under an inert atmosphere, 2,7-bis(1,3,2-dioxaboran-2-yl)-9,9-dioctylfluorene (5.20 g), bis(4-bromophenyl)-(4-secondarybutylphenyl)-amine (4.50 g), palladium acetate (2.2 mg), tri(2-methylphenyl)phosphine (15.1 mg), a 0.74 M toluene solution of a quaternary ammonium chloride catalyst (Aliquat 336) (0.91 g, manufactured by Aldrich), and toluene (70 ml) were mixed, and the mixture was heated to 105° C. A 2M aqueous sodium carbonate solution (19 ml) was added dropwise to this reaction solution, followed by refluxing for 4 hours. After the reaction, phenylboric acid (121 mg) was added, followed by further refluxing for 3 hours. Then, an aqueous sodium diethyldithiacarbamate solution was added, followed by stirring at 80° C. for 4 hours. After cooling, the reaction was washed with water (60 ml) three times, a 3% by weight aqueous acetic acid solution (60 ml) three times, and water (60 ml) three times, and was purified by passing through an alumina column and a silica gel column. The resulting toluene solution was added dropwise to methanol (3 L), the mixture was stirred for 3 hours, and the resulting solid was filtered, and dried. A yield of a high-molecular compound 2 obtained was 5.25 g.

A polystyrene-equivalent number average molecular weight of the high-molecular compound 2 was $1.2 \times 10^5$, and a polystyrene-equivalent weight average molecular weight thereof was $2.6 \times 10^5$.

Example 11 and Comparative Example 7

According to the same manner as in Example 1 except that a blue light emitting high-molecular material "LUMATION BP361" manufactured by Sumation K.K. is used in place of the blue light emitting high-molecular material 1, a liquid composition for an organic semiconductor device is produced and, using the liquid composition for an organic semiconductor device, according to the same manner as in Example 4 except that the high-molecular compound 2 is used in place of the high-molecular compound 1, an organic EL device is manufactured (Example 11). In addition, according to the same manner as in Comparative Example 1 except that a blue light emitting high-molecular material "LUMATION BP361" manufactured by Sumation K.K. is used in place of the blue light emitting high-molecular material 1, a liquid composition for an organic semiconductor device is produced and, using the liquid composition for an organic semiconductor device, according to the same manner as in Comparative Example 4 except that the high-molecular compound 2 is used in place of the high-molecular compound 1, an organic EL device is manufactured (Comparative Example 7).

Both of the manufactured devices emit blue light. When properties of these organic EL devices are measured in the same manner as in Example 4, upon constant current driving at an initial luminance of 5,000 cd/m$^2$, regarding a time during which a luminance became 50% of the initial luminance (luminance half life), remarkable improvement is observed in the organic EL device of Example 11 as compared with the organic EL device of Comparative Example 7.

Example 12 and Comparative Example 8

According to the same manner as in Example 2 except that a green light emitting high-molecular material "LUMATION GP1300" manufactured by Sumation K.K. is used in place of the green light emitting high-molecular material 1, a liquid composition for an organic semiconductor device is produced and, using the liquid composition for an organic semiconductor device, according to the same manner as in Example 5 except that the high-molecular compound 2 is used in place of the high-molecular compound 1, an organic EL device is manufactured (Example 12).

In addition, according to the same manner as in Comparative Example 2 except that a green light emitting high-molecular material "LUMATION GP1300" manufactured by Sumation K.K. is used in place of the green light emitting high-molecular material 1, a liquid composition for an organic semiconductor device is produced and, using the liquid composition for an organic semiconductor device, according to the same manner as in Comparative Example 5 except that the high-molecular compound 2 is used in place of the high-molecular compound 1, an organic EL device is manufactured (Comparative Example 8).

Both of the manufactured devices emit green light. When properties of these organic EL devices are measured in the same manner as in Example 5, upon constant current driving at an initial luminance of 8,000 cd/m$^2$, regarding a time during which a luminance became 50% of the initial luminance (luminance half life), remarkable improvement is observed in the organic EL device of Example 12 as compared with the organic EL device of Comparative Example 8.

Example 13 and Comparative Example 9

According to the same manner as in Example 3 except that a red light emitting high-molecular material "LUMATION RP158" manufactured by Sumation K.K. is used in place of the red light emitting high-molecular material 1, a liquid composition for an organic semiconductor device is produced and, using the liquid composition for an organic semiconductor device, according to the same manner as in Example 6 except that the high-molecular compound 2 is used in place of the high-molecular compound 1, an organic EL device is manufactured (Example 13). In addition, according to the same manner as in Comparative Example 3 except that a red light emitting high-molecular material "LUMATION RP158" manufactured by Sumation K.K. is used in place of the red light emitting high-molecular material 1, a liquid composition for an organic semiconductor device is produced and, using the liquid composition for an organic semiconductor device, according to the same manner as in Comparative Example 6 except that the high-molecular compound 2 is used in place of the high-molecular compound 1, an organic EL device is manufactured (Comparative Example 9).

Both of the manufactured devices emit red light. When properties of these organic EL devices are measured in the same manner as in Example 6, upon constant current driving at an initial luminance of 8,000 cd/m$^2$, regarding a time during which a luminance became 50% of the initial luminance (luminance half life), remarkable improvement is observed in the organic EL device of Example 13 as compared with the organic EL device of Comparative Example 9.

DESCRIPTION OF REFERENCE NUMERALS 1,1' . . . Organic EL device,
2 . . . Substrate,
3 . . . Anode,
4 . . . First organic layer,
5 . . . Second organic layer,
6 . . . Organic layer,
6' . . . Third organic layer,
7 . . . Cathode.

The invention claimed is:
1. A process for producing a liquid composition for an organic semiconductor device, the process comprising:
a step of reducing the amount of a halogen compound in a hydrocarbon solvent containing the halogen compound in a concentration of more than 100 ppm by weight so that the halogen compound concentration becomes not more than 100 ppm by weight;

a step of preparing an organic solvent comprising the resulting hydrocarbon solvent, the organic solvent being liquid at 1 atm and 25° C. and having a halogen compound concentration of not more than 100 ppm by weight; and a step of dissolving an organic compound which is solid at 1 atm and 25° C. in the organic solvent, wherein the organic solvent is a mixed solvent comprising a first organic solvent and a second organic solvent, the first solvent being the hydrocarbon solvent, and the step of preparing the organic solvent is a step of mixing two or more organic solvents comprising the hydrocarbon solvent containing the reduced amount of the halogen compound and the second organic solvent having a halogen compound concentration of not more than 100 ppm by weight.

2. The process according to claim 1, wherein the halogen compound is a compound containing bromine.

3. The process according to claim 1, wherein the step of reducing the amount of the halogen compound in the hydrocarbon solvent containing the halogen compound is a distillation step.

4. The process according to claim 1, wherein the organic compound is an organic compound which emits florescence.

5. The process according to claim 1, wherein the organic compound is an organic compound which emits phosphorescence.

6. The process according to claim 1, wherein the organic compound is a high-molecular compound having a polystyrene-equivalent number average molecular weight of from $10^3$ to $10^8$.

7. The process according to claim 1, wherein the organic compound is dissolved in the organic solvent so that the amount of the organic compound amount may become not less than 0.01% by weight and not more than 5.0% by weight based on the total weight of the resulting liquid composition in the step of dissolving the organic compound in the organic solvent.

8. The process according to claim 1, wherein the hydrocarbon solvent comprises at least one member selected from the group consisting of mesitylene, cyclohexylbenzene, tetralin, and decalin.

9. The process according to claim 1, wherein the hydrocarbon solvent comprises cyclohexylbenzene.

10. The process according to claim 1, wherein the organic compound is a light emitting organic compound which emits fluorescence and/or phosphorescence, or a light emitting organic compound which emits fluorescence and/or phosphorescence with a dopant which assists the light emitting function of the light emitting organic compound.

* * * * *